US009665462B2

United States Patent
Tatapudi et al.

(10) Patent No.: US 9,665,462 B2
(45) Date of Patent: May 30, 2017

(54) APPARATUSES AND METHODS FOR ARBITRATING A SHARED TERMINAL FOR CALIBRATION OF AN IMPEDANCE TERMINATION

(71) Applicant: Micron Technology, Inc., Boise, ID (US)

(72) Inventors: Suryanarayana Tatapudi, Boise, ID (US); Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/883,377

(22) Filed: Oct. 14, 2015

(65) Prior Publication Data

US 2017/0109249 A1    Apr. 20, 2017

(51) Int. Cl.
| | | |
|---|---|---|
| *G11C 5/06* | (2006.01) | |
| *G06F 11/34* | (2006.01) | |
| *G11C 8/10* | (2006.01) | |
| *G11C 8/06* | (2006.01) | |
| *G06F 11/30* | (2006.01) | |

(52) U.S. Cl.
CPC ........ *G06F 11/348* (2013.01); *G06F 11/3037* (2013.01); *G11C 8/06* (2013.01); *G11C 8/10* (2013.01)

(58) Field of Classification Search
CPC ................ G11C 5/06; G11C 8/06; G11C 8/10
USPC ............ 365/63, 185.05, 185.06, 185.11, 214
See application file for complete search history.

(56) References Cited

U.S. PATENT DOCUMENTS

| | | | |
|---|---|---|---|
| 4,511,959 | A | 4/1985 | Nicolas et al. |
| 4,745,548 | A | 5/1988 | Blahut |
| 7,432,731 | B2 | 10/2008 | Bains et al. |
| 7,436,202 | B2 | 10/2008 | Lin et al. |
| 7,990,174 | B2 | 8/2011 | Park |
| 2004/0128429 | A1 | 7/2004 | Khandekar et al. |
| 2004/0240255 | A1* | 12/2004 | Smith ............... G11C 11/16 365/158 |
| 2005/0226080 | A1* | 10/2005 | Lee ................... G11C 5/04 365/230.03 |
| 2006/0158198 | A1 | 7/2006 | Fujisawa |

(Continued)

FOREIGN PATENT DOCUMENTS

WO    2010144624 A1    12/2010

OTHER PUBLICATIONS

U.S. Appl. No. 14/883,454, entitled "Apparatuses and Methods for Arbitrating a Shared Terminal for Calibration of an Impedance Termination", filed Oct. 14, 2015.

(Continued)

*Primary Examiner* — Harry W Byrne
(74) *Attorney, Agent, or Firm* — Dorsey & Whitney LLP

(57) ABSTRACT

An arbitration system and method is disclosed. The apparatus includes first and second memory devices, and a resistor coupled in common to the first and second memory devices, the first memory device including a first calibration circuit configured to perform, when activated, a first calibration operation based on the resistor and a first arbiter configured to activate the first calibration circuit responsive, at least in part, to an assertion of a first command or keep the first calibration circuit inactive irrespective of the assertion of the first command.

11 Claims, 10 Drawing Sheets

(56) References Cited

U.S. PATENT DOCUMENTS

| | | |
|---|---|---|
| 2009/0009212 A1 | 1/2009 | Brox |
| 2011/0128038 A1 | 6/2011 | Ko |
| 2013/0015880 A1 | 1/2013 | Haraguchi |
| 2014/0185384 A1 | 7/2014 | Kim et al. |
| 2014/0185401 A1* | 7/2014 | Yang ............... G11C 7/062 |
| | | 365/207 |
| 2015/0067292 A1 | 3/2015 | Grunzke |
| 2015/0364177 A1 | 12/2015 | Lee |
| 2016/0042769 A1 | 2/2016 | Moran |

OTHER PUBLICATIONS

Singh, et al., "MOUSETRAP: High-Speed Transition-Signaling Asynchronous Pipelines", IEEE Transactions on Very Large Scale Integration (VLSI) Systems, vol. 15, No. 6, Jun. 2007, 15 pages.
U.S. Appl. No. 15/396,259, entitled "Timing Based Arbiter Systems and Circuits for ZQ Calibration," filed on Dec. 30, 2016.

\* cited by examiner

APPARATUSES AND METHODS FOR ARBITRATING A SHARED TERMINAL FOR CALIBRATION OF AN IMPEDANCE TERMINATION

TECHNICAL FIELD

The present disclosure is directed to systems and methods for mitigating contention that may occur in a semiconductor memory device on an external resistor pin when multiple memory devices attempt to use the pin for a calibration operation.

BACKGROUND

Semiconductor devices, such as memory devices and processors, transmit data across data communication lines that are configured to have carefully matched impedance values. Variations in certain operating parameters such as temperature or the like can result in impedance mismatches that can adversely affect data transmission rates and quality. In order to mitigate these adverse scenarios, memory devices may include programmable impedance termination components that have impedance values that can be adjusted as operating conditions change. In some implementations, programmable impedance termination components are calibrated based on voltage measurements made on a circuit node that connects to an external resistor. In some cases, a limited number of external connections are available for connection to an external resistor. These external connections may be shared between multiple devices that use the connection for calibration purposes. Thus, contention for use of the external connection may arise when two or more devices attempt to use the external connection at the same time or substantially the same time.

DETAILED DESCRIPTION

The present disclosure is directed to a memory apparatus that includes at least first and second memory devices. The memory apparatus may also include an impedance calibration terminal (e.g., an impedance calibration pad) coupled in common to the first and second memory devices. A resistor may be coupled to an impedance calibration pin that is coupled to the impedance calibration pad for calibration of programmable impedance termination components. The first memory device may include a first calibration circuit configured to perform, when activated, a first calibration operation based on the resistor and a first arbiter configured to activate the first calibration circuit responsive, at least in part, to an assertion of a first command or keep the first calibration circuit inactive irrespective of the assertion of the first command. Similarly, the second memory device may include a second calibration circuit configured to perform, when activated, a second calibration operation based on the resistor and a second arbiter configured to activate the second calibration circuit responsive, at least in part, to an assertion of a second command or keep the second calibration circuit inactive irrespective of the assertion of the second command. In one implementation, the first and second arbiter circuits provide an activation signal responsive to an enable signal provided through a token ring bus. In other implementation, the first and second arbiter circuits provide an activation signal responsive to voltage monitoring on the resistor.

Figure 1:
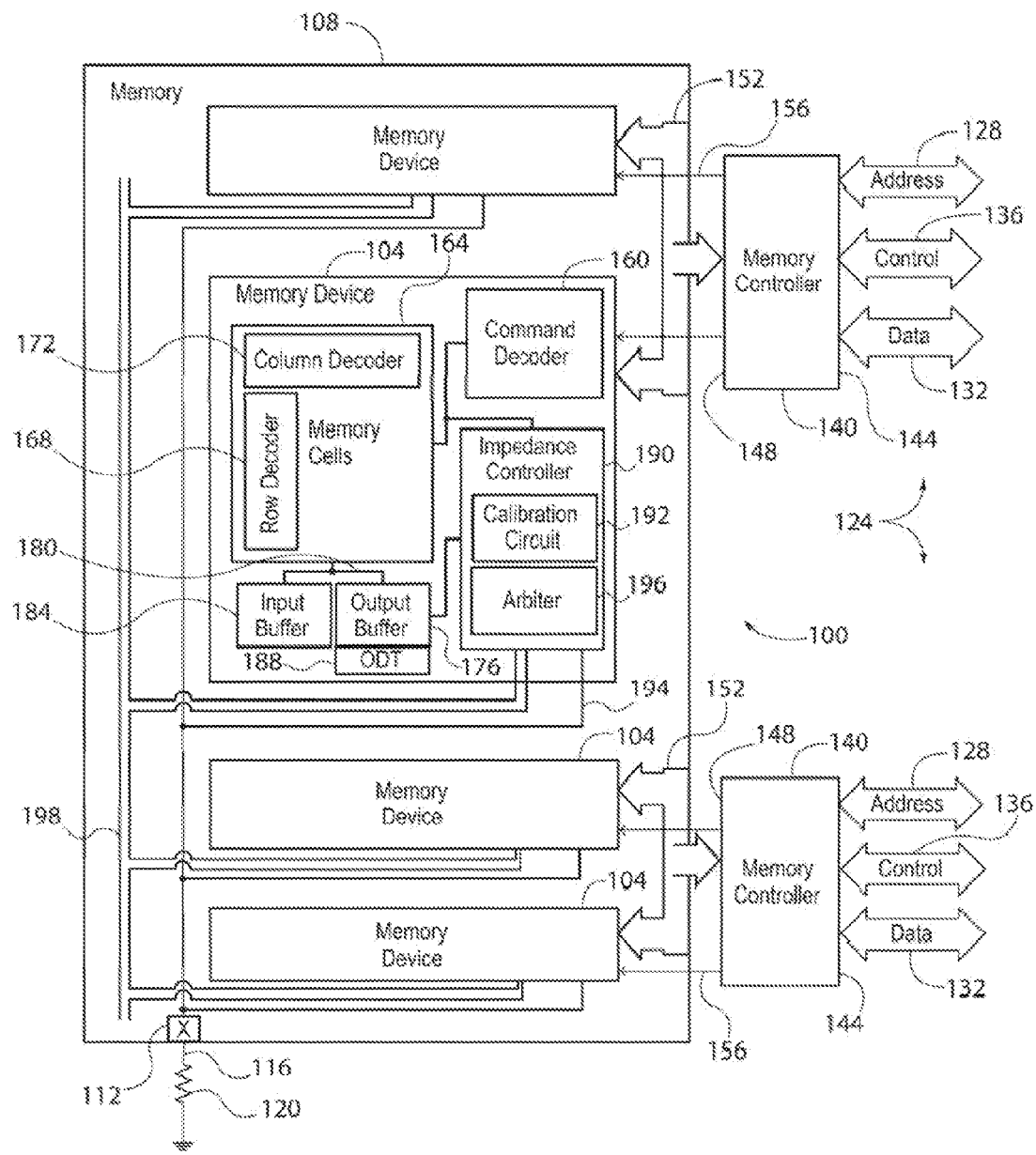
FIG. 1 is block diagram of a semiconductor device in accordance with the present disclosure.

FIG. 1 is block diagram of a semiconductor device in accordance with the present disclosure. Referring to FIG. 1, the semiconductor device of the present disclosure will be described with reference to a semiconductor memory 100, by way of example and not limitation. The memory 100 may be a volatile memory such as a SRAM or DRAM, or a nonvolatile memory such as a FLASH memory or a ferroelectric memory. In one embodiment, the memory 100 may be a Double Data Rate (DDR) memory, such as a Low Power Double Data Rate 4 (LPDDR4) memory. In accordance with various embodiments, the semiconductor memory 100 may include a plurality of individual memory devices 104 that may be arranged on one or more different semiconductor dies.

The memory 100 may include a package 108 that contains and interconnects the various individual memory devices 104. The package 108 may provide a plurality of external pins that couple to contact pads arranged on the interior of the package 108. The pins and pads may provide electrical coupling such as between the memory devices 104 and the larger system to which the memory 100 is coupled. As shown in FIG. 1, the memory 100 may include an internal impedance calibration pad, which may be referred to as the ZQ pad 112, and a corresponding external impedance calibration pin, which may be referred to as the ZQ pin 116. An external resistor, which may be referred to as the ZQ resistor 120, may couple to the ZQ pad 112 through the ZQ pin 116. One or more of the individual memory devices 104 may use the ZQ resistor 120 in an impedance calibration process, which is described in greater detail below.

The memory 100 may be arranged as a component of a computing device such as a laptop computer, a desktop computer, a cellular or other mobile device, a table computer, personal digital assistant, and so on. The memory 100 may be mounted in an appropriate memory slot or otherwise interconnected with the computing device such that communication may take place through the pins on the package of the memory 108. A computing device that includes the memory 100 may generally include one or more processors (not shown in FIG. 1). The processor or processors may be single core or multi-core in various implementations. Typically, the memory 100 functions as a passive device in the larger system, receiving and executing commands received from a processor or processor core. Here, the computing device may include a bus interface 124 across which the memory 100 and the processor or processor cores may communicate. As shown in FIG. 1, the bus interface 124 may include an address bus 128, a data bus 132, and a command bus 136. FIG. 1 shows these various buses as separate components by way of example and not limitation. In some instances, the bus interface 124 may multiplex certain of these separate buses. For example, in some implementations, the address bus 128 and the command bus 136 may be time division multiplexed such that these buses use the same physical lines in different time slices.

The memory 100 may be associated with one or more memory controllers 140 that are configured to provide data communication to and from the memory 100. The memory controller 140 may include a front end 144 that communicates across the bus interface 124. Similarly, the memory controller 140 may include a back end 148 that communicates with the memory 100. Each memory controller 140 may communicate across a separate memory bus 152 that couples the back end 148 of the memory controller 140 to one or more of the individual memory devices 104 associated with the memory 100. Each memory bus 152 associated with a given controller 140 may include address, data, and control lines that are coupled in common between the various memory devices 104 with which the controller 140 communicates. Each memory bus 152 may additionally include individual chip select lines 156 that may be selectively asserted to enable one of the memory devices 104 to send or receive data across the common address, data, and control lines. Through the combination of individual chip select lines 156 and common address, data, and control lines, a memory bus 152 associated with a given controller 140 provides separate communication pathways between the controller and each of the various memory devices 104 with which the controller 140 communicates.

In operation, a processor or processor core sends a command to the memory 100 by first sending the command across the bus interface 124. A memory controller 140 receives the command from across the bus interface 124 and routes the command to the appropriate memory device 104 on the memory 100. Here, the memory controller 140 asserts the appropriate chip select line 156 and sends the command across the common address, data, and control lines of the memory bus 152. The appropriate memory device 104 receives the command from the memory controller 140 and initially processes the command through the operation of a command decoder 160. The command decoder 160 may be configured to recognize a plurality of commands that correspond to various operations that may be executed by the memory device 104. In the following discussion, certain commands, such as a read/write command and a calibration command, are each described in detail in order to more particularly illustrate certain embodiments of the present disclosure. It should be appreciated, however, that the command decoder 160 is generally configured to recognize and decode a number of commands that are not specifically discussed herein. Discussion of those various commands and illustration in the drawings of specific components related to those commands are omitted for the sake of clarity and brevity.

In some instances, the command decoder 160 may receive, decode, and process a read/write command. A read/write command generally directs the memory device 104 to read or write data to or from one or more memory cells in a memory array 164 associated with the memory device 104. In processing the read/write command, the command decoder 160 may provide internal control signals to read data from and write data to the memory array 164. Row and column address signals may be provided (e.g., applied) to an address latch in the memory device 104 through an address bus. The address latch may then provide (e.g., output) a separate column address and a separate row address. The address latch may provide row and column addresses to a row address decoder 168 and a column address decoder 172, respectively. The column address decoder 172 may select signal lines extending through the array 164 corresponding to respective column addresses. The row address decoder 168 may be coupled to a signal line driver that activates respective rows of memory cells in the array 164 corresponding to received row addresses. The selected signal line or lines corresponding to a received column address may be coupled to read/write circuitry to provide read data to an output data buffer 176 via an input-output data path 180. Write data may be provided to the memory array 164 through an input data buffer 184 and the memory array read/write circuitry. A clock generator may provide an internal clock signal responsive to an input clock signal. The internal clock signal may be used by circuits of the memory, for example, the output data buffer 176 and the input data buffer 184.

In other instances, the command may be a calibration command asserted. A calibration command is generally asserted to cause a memory device 104 to calibrate an impedance of each of programmable impedance termination component 188 and the output buffer 176. In some embodiments, the programmable impedance termination component is an On Die Termination (ODT) circuit. As known, an ODT circuit may be adjusted to provide a matched impedance. In FIG. 1, the programmable impedance termination component 188 is depicted independently of the output buffer 176. However, it is also possible that the output buffer includes the programmable impedance termination component 188 as a part of the output buffer. In this case, the ODT operation is performed by at least a part of the output buffer. Upon receipt, the command decoder 172 routes the calibration command to an impedance controller 190, which generally operates to adjust impedances of the programmable impedance termination component 188 and the output buffer 176. Each of the programmable impedance termination component 188 and the output buffer 176 generally includes a group of pull-up and pull-down transistors that are controlled to be enabled or disabled by the impedance controller 190. The impedance controller 190 enables/disables the pull-up and pull-down transistors so that the impedance of the output buffer matches the impedance of the data bus. In this way, signal reflections that result from impedance mismatches are avoided.

The calibration circuit 192 generally operates by measuring the voltage at the ZQ pin 116 and using that voltage to adjust the impedance of the programmable impedance termination component 188 and the output buffer 176. When current is sunk from the ZQ resistor 120 as part of a calibration command, the current may be generated by the calibration circuit. The impedance of the ZQ resistor 120 represents the impedance that each of the programmable impedance termination component 188 and the output buffer 176 sees on the data bus to which it is coupled. This impedance of each of the programmable impedance termination component 188 and the output buffer 176 may vary as various operating conditions change. For example, temperature changes that occur during the operation of the memory 100 may lead to variations in these impedances. By measuring the impedance on the resistor 120, of which impedance is basically stable regardless of the conditions change, the calibration circuit 192 makes an impedance measurement that corresponds to current operating conditions. This impedance measurement may then be used to set the impedance value of each of the programmable impedance termination component 188 and the output buffer 176 such that it matches current operating conditions. For example, the calibration circuit 192 may measure the voltage at the ZQ pad 112 and compare that voltage to an internal reference voltage. This comparison may be made through the operation of a comparator that outputs a comparison result. The comparison result may then be used to step up or step down the voltage at the ZQ pad 112 so as to bring the ZQ pin 116 voltage closer to the reference voltage. This comparison process generates control codes that may be used to enable/disable the various pull down and pull up transistors associated with the programmable impedance termination component 188 and the output buffer 176 to adjust their impedances properly.

As can be seen in FIG. 1, the ZQ pin 116 may be shared between multiple memory devices 104. Here, each impedance controller 190 may be coupled to a common signal line, referred to herein as the calibration bus 194. As can be seen in FIG. 1, the calibration bus may couple the ZQ pad 112 to at least a first and second impedance controller 190. Because the first and second memory devices 104 are coupled to a single calibration bus 194, contention on the ZQ pin 116 may occur in the event that both the first and second memory devices 104 perform respective calibration operations concurrently. In the configuration of FIG. 1 where the first and second memory devices 104 communicate with separate memory controllers 140, it may be the case that the controllers 140 are not generally configured to communicate with each other. Stated another way, one memory controller 104 may not necessarily know what the other memory controller 140 is doing. Thus, both memory controllers 140 may issue calibration commands to their respective memory devices 104 to concurrently perform respective calibration operations, and the memory devices 104 may then respond by concurrently attempting to calibrate using the ZQ pad 112. This contention for the ZQ resistor may be resolved through the operation of an arbiter circuit 196 in accordance with the present disclosure.

An arbiter circuit 196 may be generally configured to allow the calibration circuit 192 with which it is associated to proceed with its calibration operation only when the arbiter 196 has possession of a token from a token ring bus 198. The token ring bus 198 may couple two or more of the arbiter circuits associated the memory 100 in a circular configuration such that each arbiter circuit 196 is coupled to at least one neighboring arbiter circuit 196. The first neighboring arbiter circuit 196 is arranged as an upstream arbiter circuit and the second neighboring arbiter circuit is arranged as the downstream arbiter circuit. Here, a given arbiter circuit 196 may be configured to receive the token from its neighboring upstream arbiter circuit and to provide the token (e.g., transmit) along the loop to its neighboring downstream arbiter circuit. In some implementations, the token ring bus 198 may only include two arbiter circuits 196. Here, a given arbiter circuit has one neighboring circuit with which it receives and transmits the token. In this way, the token circulates among the various arbiter circuits 196 on the token ring bus 198. In some embodiments, the token may be an enable signal. An arbiter circuit that possesses the token may be said to keep the enable signal within. An arbiter circuit that does not possess the token may be said to be free of the enable signal.

When a particular arbiter circuit 196 has the token, that arbiter circuit 196 may allow the calibration circuit 192 with which it is associated to proceed with calibration. When the arbiter circuit 196 does not have the token, that arbiter circuit 196 may not permit the calibration circuit 192 with which it is associated to proceed with calibration. Stated another way, when the arbiter circuit 196 does not have the token, the arbiter circuit 196 may keep the calibration circuit 196 inactive irrespective of whether or not a calibration command is asserted and received by the memory device 104. In connection with providing and receiving a token, the arbiter circuit 196 may include an input line and an output line which, respectively, receive and provide the token. In this regard, each of the arbiter circuits 196 is coupled to the token ring bus 198 to catch the token which enables the arbiter circuit to take control of the ZQ pin 116 with excluding the other arbiter circuits. FIG. 1 shows four memory devices 104 coupled to a single ZQ pin 116 by way of example and not limitation. As described in greater detail below, various implementations in accordance with the present disclosure may include different numbers of ZQ pins 116 and/or different numbers of memory devices 104 attached thereto.

Figure 2:
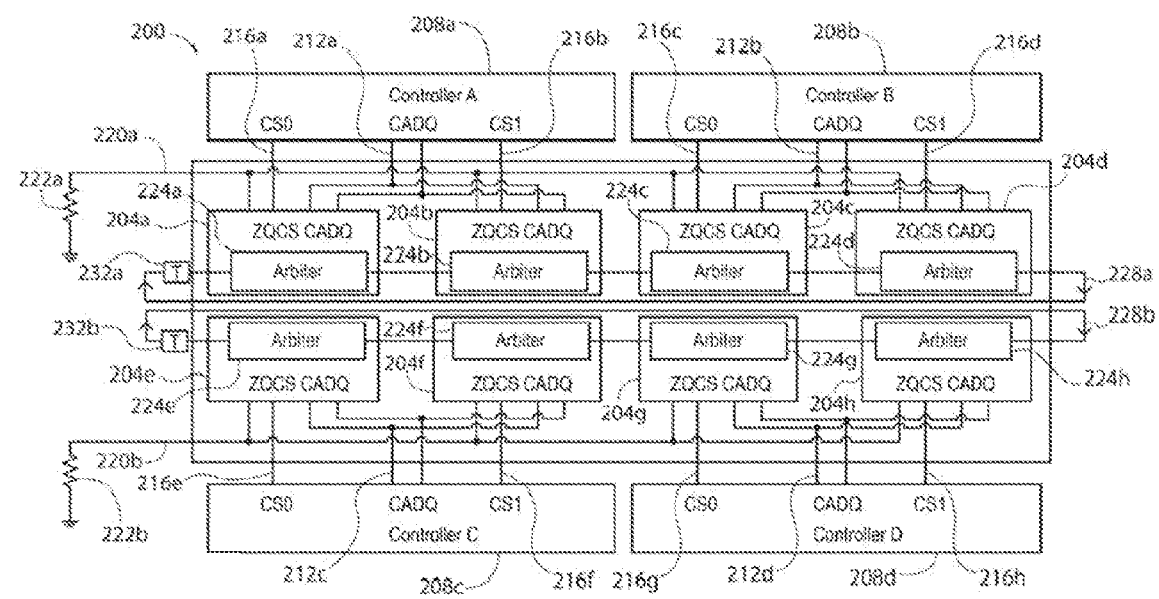
FIG. 2 is an example memory that includes a plurality of memory devices in accordance with the present disclosure.

FIG. 2 is an example memory 200 that includes a plurality of memory devices 204a-h in accordance with the present disclosure. Each of the memory devices 204a-h may be implemented by the memory device 104 previously described with reference to FIG. 1. The memory devices 204a-h are arranged in a four channel, two rank configuration. Each memory channel is associated with a particular memory controller 208a-d. Thus, the memory 200 shown in FIG. 2 includes a first channel associated with a first controller 208a labelled as "Controller A," a second channel associated with a second controller 208b labelled as "Controller B," a third channel associated with a third controller 208c labelled as "Controller C." and a fourth channel associated with a fourth controller 208d labelled as "Controller D." Each of the controllers 208a-b is coupled to two memory devices, which make up the two ranks associated with each channel. Controller 208a is configured to communicate across a common command and address bus 212a with memory devices 204a-b, which make the first and second rank of the first channel. Similarly, controller 208b is configured to communicate across a common command and address bus 212b with memory devices 204c-d, which make the first and second rank of the second channel; controller 208c is configured to communicate across a common command and address bus 212c with memory devices 204e-f, which make the first and second rank of the third channel; and controller 208d is configured to communicate across a common command and address bus 212d with memory devices 204g-h, which make the first and second rank of the first channel. The controllers 208a-d coupled to the memory 200 select the rank to which data is to be transmitted or received through chip select lines 216a-h that couple to the respective memory devices 204a-h.

The example memory 200 of FIG. 2 includes eight memory devices 204a-h. In this configuration, the first, second, third, and fourth memory devices 204a-d are coupled to a calibration bus 220a to a shared impedance calibration pin 222a. Similarly, the fifth, six, seventh and eighth memory devices 204e-h are coupled to a calibration bus 220b to a shared impedance calibration pin 222b. This arrangement can lead to potential contention on either of the first and second ZQ pins 222a-b. For example, contention can arise on the first ZQ pin 222a when concurrent calibration commands are issued to two or more of the first, second, third or fourth memory devices 204a-d. Concurrent calibration commands are issued when an external calibration command is received and processed the various controllers 208a-d associated with the memory 200. In one example, contention for the ZQ pin 222a may occur in the event that controller 208a issues a calibration command on memory device 204a and controller 208b issues a calibration command to memory device 204c. Here, it may be the case the no communication path exists between the first and second controllers 208a-b and no communication path exists between the two memory devices 204a,c. Thus, when memory device 204a attempts to take control of the first ZQ pin 222a, it may have no knowledge of what the second memory device 204c may or may not be doing with the first ZQ pin 222a. In order to resolve these potential contentions, the eight memory devices 204a-h may each include an arbiter circuit 224a-h in accordance with the present disclosure.

Arbiter circuits 224a-h may be generally configured to resolve contention on the ZQ pins 222a-b that may occur when concurrent calibration commands are issued by two or more of the eight memory devices 204a-h. The first through eighth memory devices 204a-h are each coupled to one of two token ring buses 228a-b. In the embodiment illustrated in FIG. 2, there are four arbiter circuits that arbitrate for control of the same ZQ pin. For example, the first through fourth arbiter circuits 224a-d arbitrate for control of the first ZQ pin 222a. The fifth through eighth arbiter circuits 224e-h arbitrate for control the second ZQ pin 222b.

In operation, the first, second, third, and fourth arbiter circuits 224a-d use a first token ring bus 228a in an arbitration protocol that selectively grants access to the first ZQ pin 222a. Similarly, the fifth, sixth, seventh, and eighth arbiter circuits 224e-h may use a second token ring bus 228b in an arbitration protocol that selectively grants access to the second ZQ pin 222b. As described in connection with FIG. 1, ZQ pins 222a-b are each coupled to an external resistor that is used in a calibration operation executed by a calibration circuit in response to a calibration command. The first, second, third, and fourth arbiter circuits 224a-d receive and provide a first token 232a among themselves such that the first token 232a circulates around the first token ring bus 228a. By way of example, the second arbiter circuit 224b receives the first token 232a from the first arbiter circuit 224a and provides the token 232a to the third arbiter circuit 224c. When the first token 232a reaches the fourth arbiter circuit 224d, the fourth arbiter circuit 224d may provide the first token 232a back to the first arbiter circuit 224d so that the first token 232a continues around the token ring bus 228a. In a similar fashion, the fifth, sixth, seventh, and eight arbiter circuits 224e-h receive and provide a second token 232b among themselves such that the second token 232b circulates around the second token ring bus 228b.

If a given one of the arbiter circuits 224a-h has possession of a token, that arbiter circuit may activate its corresponding calibration circuit (shown in FIG. 1) to proceed with a calibration operation. Referring to the first arbiter circuit 224a associated with the first memory device 204a by way of example, if the first arbiter circuit 224a has possession of the first token 232a, the first arbiter circuit 224a may activate its corresponding calibration circuit to proceed with a calibration operation if a calibration command is received or is pending. If the first arbiter circuit 224a has possession of the first token 232a and the first memory device 204a has not received a calibration command, the first arbiter circuit 224a may hold the first token 232a for a predetermined time in the event that a calibration command is received at a later time. If the first memory device 204a does not receive a calibration command within the predetermined time, the first arbiter circuit 224a may provide the first token 232a down the first token ring bus 228a to the next arbiter circuit. If the first memory device 204a receives a calibration command and is not in possession of the first token 232a, the first arbiter circuit 224a may wait until it receives the first token 232a before enabling its corresponding calibration circuit to proceed with the calibration operation. Example operations in accordance with an arbitration protocol according to an embodiment of the disclosure are discussed in greater detail below in connection with FIGS. 5 and 6.

FIG. 2 shows a memory 200 having eight memory devices 204a-h arranged in a four channel, two rank configuration by way of example and not limitation. Other memory configurations may be used in accordance with the present disclosure. Generally, a particular embodiment may include any number of memory devices coupled in common on a given token ring bus.

Figure 3:
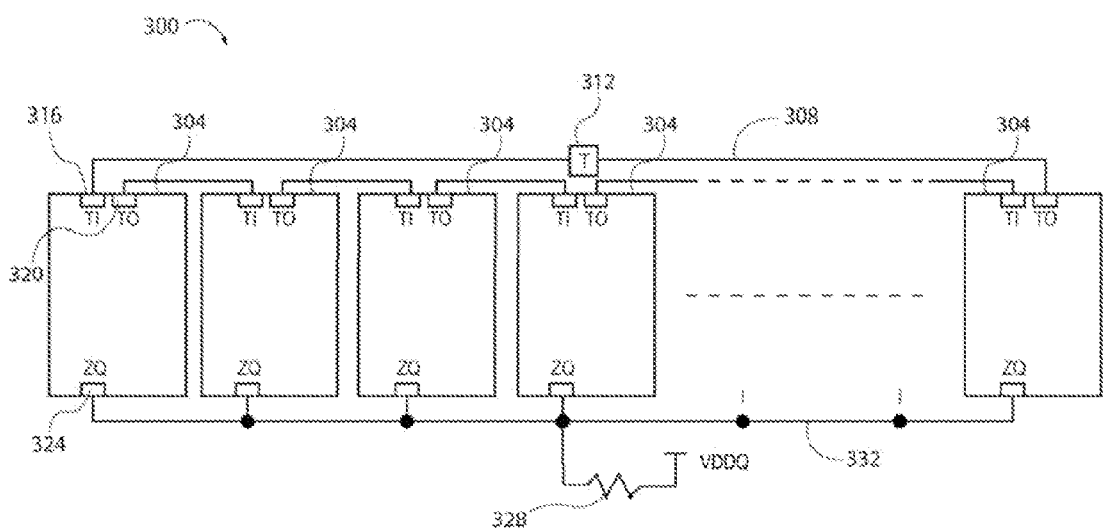
FIG. 3 is another example memory that includes a plurality of memory devices in accordance with the present disclosure.

FIG. 3 is a block diagram of an example memory 300 that includes a plurality of memory devices 304 coupled in common to a single token ring bus 308. As shown in FIG. 3, a token 312 circulates on the token ring bus 308 among the various memory devices 304. Each memory device 304 includes a token input line 316. The token input line 316 is generally configured to receive the token 312 from the token ring bus 308. Each memory device 304 additionally includes a token output line 320. The token output line 320 is generally configured to provide the token 312 from the memory device 304 back onto the token ring bus 308. Each memory device 304 additionally includes a ZQ pad 324. The various ZQ pads 324 are coupled in common to a single a ZQ pin 328.

FIG. 1 shows an example configuration where various memory devices 104 are included within a common package 108. In contrast, the embodiment of FIG. 3 includes various memory devices 304 that are not included in a common package. For example, each of the memory devices 304 may be in a separate package Thus, in addition to showing a memory device having a plurality of memory devices coupled in common to a single token ring bus, FIG. 3 also shows an alternative configuration for the memory package. In this configuration, each memory device 304 includes a separate ZQ pad 324. The various ZQ pads 324 are coupled to an external signal line 332, which, in turn, couples the pads to the ZQ resistor 328.

In accordance with various embodiments of the present disclosure, an arbiter circuit may include a data storage element that stores data representing possession or non-possession of the token. For example, the data storage element may store a "one" digital value to represent possession of the token. Similarly, the data storage element may store a "zero" digital value to represent non-possession of the token. When a given arbiter circuit does not possess the token, the digital storage element may store a "zero" digital value. When the given arbiter circuit receives the token, the digital storage element may switch to storing a "one" digital value. Continuing in this manner, when the arbiter circuit provides the token down the token ring bus, the digital element may again switch to storing a "zero" digital value.

Figure 4:
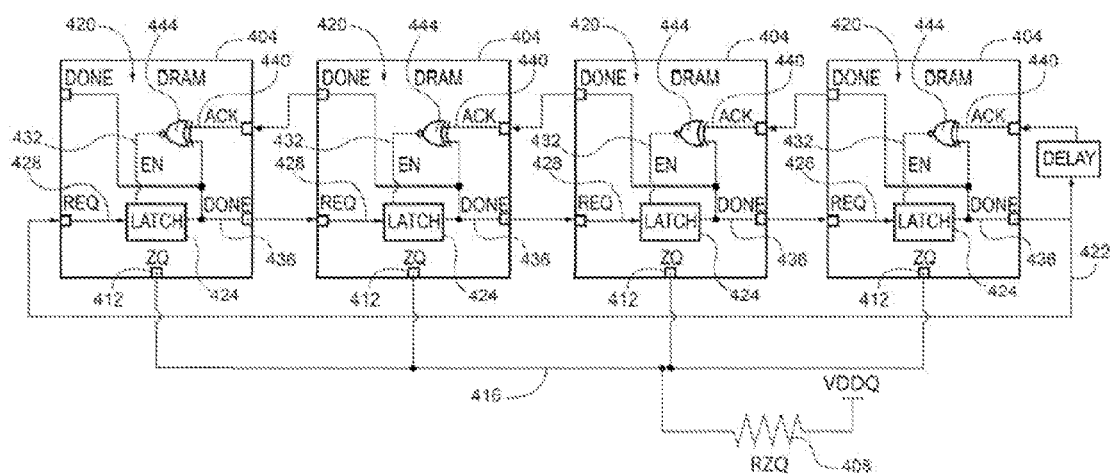
FIG. 4 is a circuit diagram for an example token ring bus in accordance with the present disclosure.

FIG. 4 is an illustration of a token ring bus 400 according to an embodiment of the disclosure. The token ring bus 400 may be used to implement the previously described example configuration. However, it should be appreciated that in other implementations a "zero" digital value represents possession of the token and a "one" digital value represents non-possession of the token.

FIG. 4 is a simplified block diagram that shows a group of data storage elements 404 coupled in common to a single ZQ resistor 408. The data storage elements 404 may be a component of an arbiter circuit associated with a memory device in accordance with the present disclosure. In the embodiment of FIG. 4, each data storage element 404 includes a ZQ pad 412. Each ZQ pad 412 is coupled to a signal line 416 which, in turn, couples the various data storage elements 404 to the ZQ resistor 408. FIG. 4 illustrates, for each data storage element 404, a portion of an arbiter circuit 420. The coupling between the arbiter circuits 420 form a token ring bus 422. Each data storage element 404 includes a latch 424 that is associated with the arbiter circuit 420 and that may be configured to store digital data. The various latches 424 may be configured such that a single latch 424 at a time on the token ring bus 422 stores a "one" digital value. With a single latch 424 storing a "one" digital value, the remainder of the latches 424 on the token ring bus 422 store a "zero" digital value. The data storage element 404 having a latch 424 that stores a "one" digital value is considered to have possession of the token that circulates on the token ring bus 422.

When a given data storage element 404 has a latch 424 that contains a "one" digital value, the associated calibration circuit (shown in FIG. 1) may be enabled to proceed with a calibration command as described above in connection with FIG. 2. The individual arbiter circuits 420 shown in FIG. 4 may be configured to provide the "one" digital value down the token ring bus 422 through various input and output lines. As shown in FIG. 4, a given arbiter circuit 420 may include a REQ input line 428. The REQ input line 428 may be used to receive a signal that when asserted indicates that the adjacent arbiter circuits 420 is providing or attempting to provide the token down the token ring bus 422. The REQ line 428 may be received as input at the latch 424. When enabled through an enable line coupled to an output of XNOR gate 444, the latch 424 may capture the data on the REQ line 428 so as to register that the token is received at the arbiter circuit 420.

An arbiter circuit 420 may additionally include an output line 436, labeled in FIG. 4 as "DONE." The DONE line 436 corresponds to at least the output of the latch 424. When asserted, the DONE line 436 may indicate that the arbiter circuit 420 is ready to provide the token down the token ring bus 422. The DONE line 436 may be asserted when one or more different conditions are met. In one respect, the DONE line may be asserted when a calibration command is complete. Here, the memory device of which the arbiter circuit 420 is included has finished the calibration operation that it executes while holding the token. Once this calibration operation is finished, the arbiter circuit 420 may provide the token along the token ring bus 422. In other instances, the DONE line 436 may be asserted, in part, when the token has been held by the arbiter circuit 420 for a predetermined time. This predetermined time may correspond to an amount of time for which the arbiter circuit 420 may hold the token and wait for a calibration command to be received. If a calibration command is not received within the predetermined time, the arbiter circuit 420 may provide the token along the token ring bus 422.

A particular DONE line 436 may be coupled to both an upstream arbiter circuit 420 on the token ring bus 422 and to a downstream arbiter circuit 420 on the token ring bus 422. By way of illustration. FIG. 4 shows two outputs from an arbiter circuit 420 for the DONE line 436. However, in some implementations, an arbiter circuit 420 may include one output for a particular DONE line 436. In a given implementation, the DONE line 436 may serve two purposes. In one respect, the DONE signal 436 may indicate to the downstream arbiter circuit 420 that the given arbiter circuit 420 is ready to provide the token down the token ring bus 422. Additionally, the DONE line may be used to signal to the upstream arbiter circuit 420 that providing the token to the given arbiter circuit 420 is complete. In this regard, the DONE line 436 may be coupled to an ACK line 440 associated with an upstream calibration circuit 420. As shown in FIG. 4, the ACK signal 440 may be coupled to an XNOR gate 444 that additionally has as an input coupled to the output of the latch 424. The output of the XNOR gate 440 may be used to enable the latch 420. When the enable line coupled to an output of XNOR gate 444 is asserted the latch 420 is enabled to sample the input line from the REC line 428 associated with the downstream arbiter circuit 424.

Figure 5:
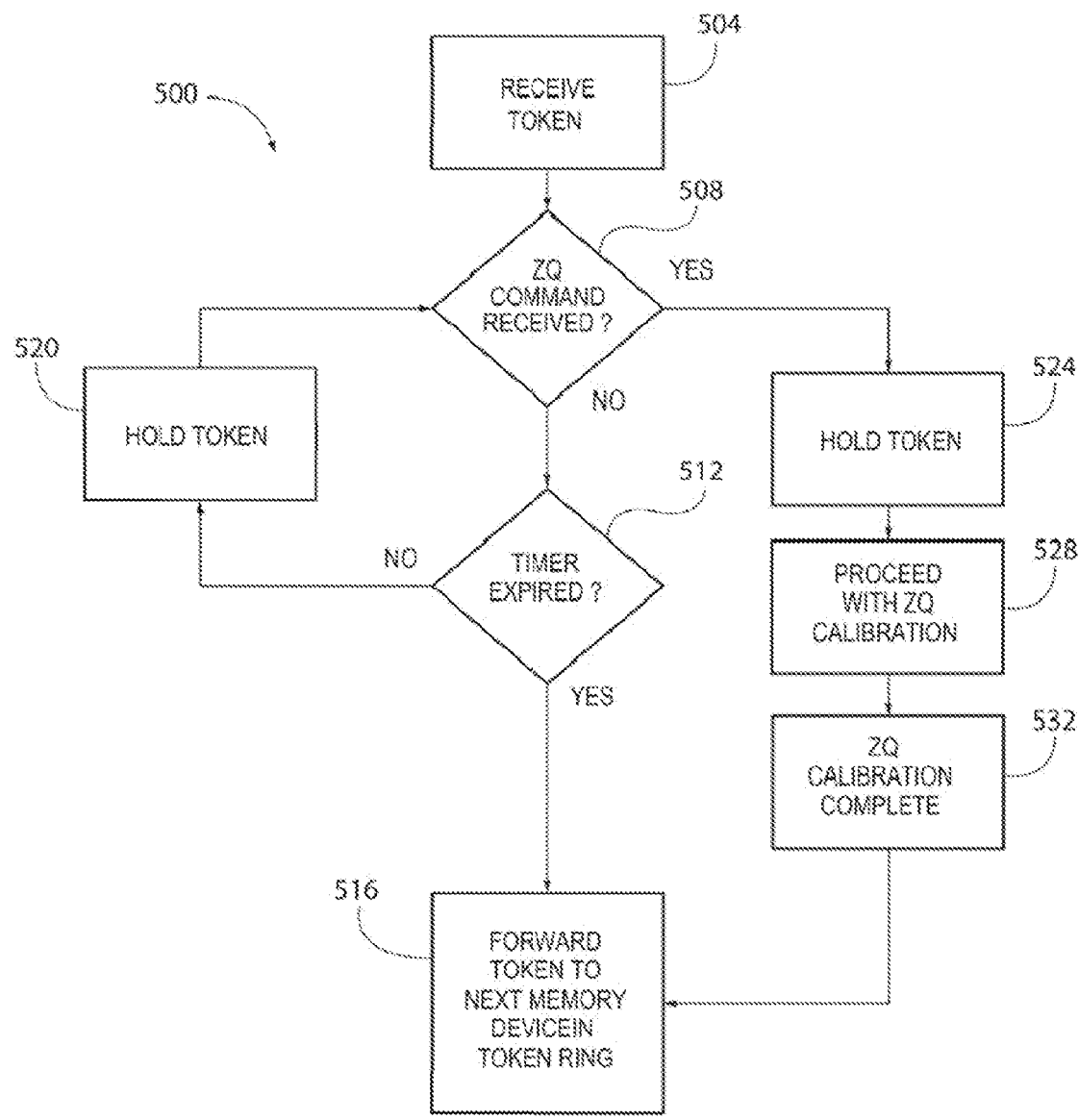
FIG. 5 is a flow diagram for an arbitration method in accordance with the present disclosure including operations executed in response to receiving a token.

FIG. 5 is a flowchart 500 that illustrates operations of an arbiter circuit in accordance with present embodiments. Flowchart 500 illustrates operations that occur when an arbiter circuit receives a token, which allows the arbiter circuit to activate a corresponding calibration circuit to proceed with a calibration operation. Thus, initially, in operation 504, a token is received from a token ring bus at an arbiter circuit. Following operation 504, operation 508 may be executed.

In operation 508, the arbiter circuit determines if a calibration command has been asserted and received by the memory device of which the arbiter circuit is included. The arbiter circuit may be generally configured to hold the token for a predetermined time during which the arbiter circuit may activate a corresponding calibration circuit to perform a calibration operation. The predetermined time may be measured by a timer. In operation 512, the timer is checked to determine if the predetermined time has expired. If the timer has not yet expired, the token is held by the arbiter circuit at operation 520 before again determining if a calibration command has been received at operation 508. If the predetermined time has expired, operation 516 may been executed. In operation 516, the arbiter circuit provides the token to the next memory device in the token ring.

If, in operation 508, it is determined that the calibration command is received, operation 524 may be executed. In operation 524, the arbiter circuit holds the token. While holding the token the arbiter circuit activates, in operation 528, a calibration circuit with which it is associated to proceed with a calibration operation. In operation 532, the calibration operation completes. Following operation 532, operation 516 may be executed where the token is provided along the token ring bus to the next arbiter circuit.

Figure 6:
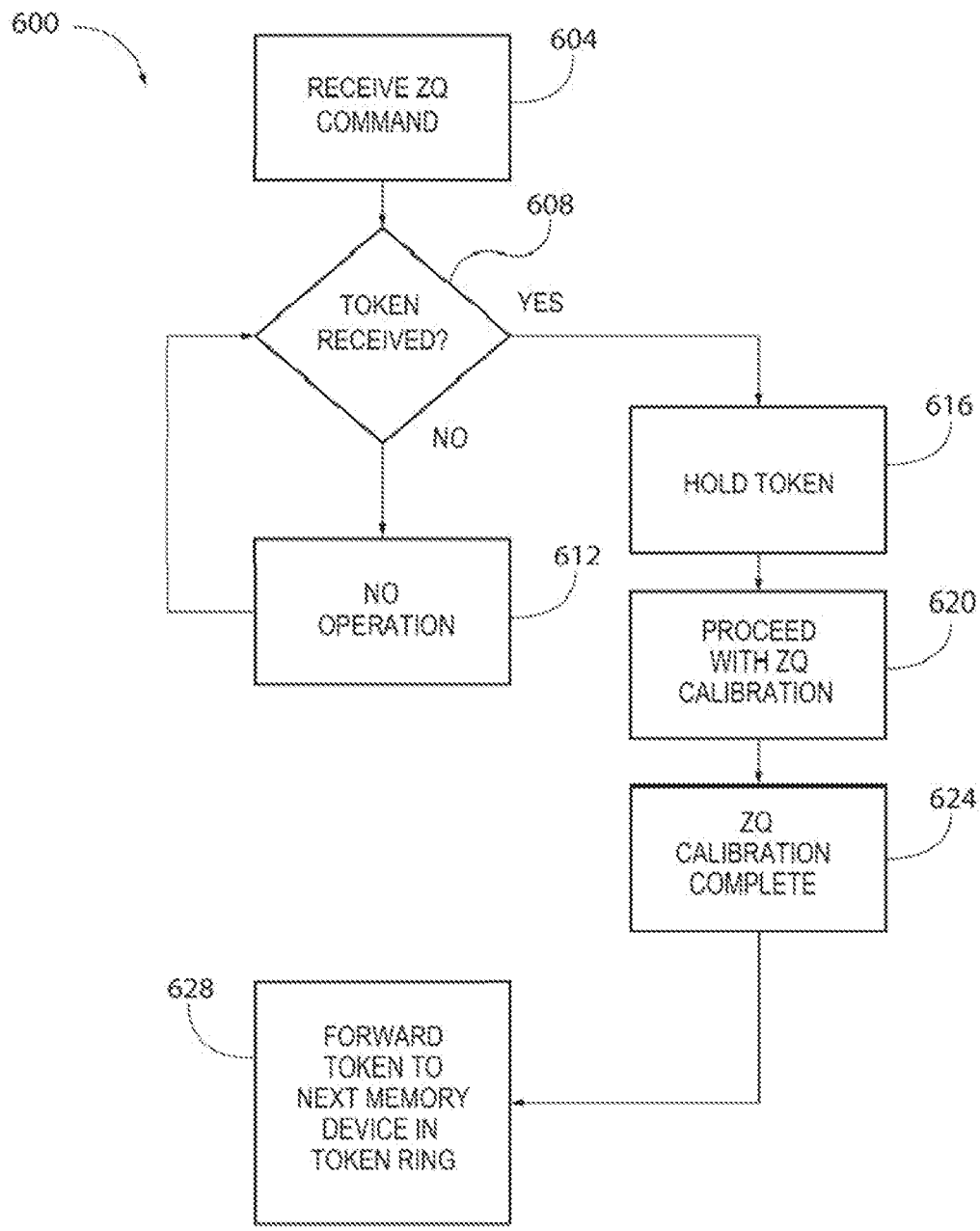
FIG. 6 is a flow diagram for an arbitration method in accordance with the present disclosure including operations executed in response to receiving a calibration command.

FIG. 6 is a flowchart 600 that illustrates example operations that may be executed by an arbiter circuit in accordance with the present disclosure. The operations illustrated by flowchart 600 may be executed when a memory device receives a calibration command. As previously described, an arbiter circuit may be configured to wait until a token is received before that memory device executes the calibration command. Thus, initially, in operation 604, a calibration command asserted by the system in which the memory device is included may be received by the memory device. Following operation 604, operation 608 may be executed.

In operation 608, an arbiter circuit included in the memory device may determine if a token has been received from the token ring bus. If, in operation 608, it is determined that no token has been received, then the arbiter circuit may wait for the token. This waiting is represented in FIG. 6 by operation 612, which indicates that no operation occurs. Following operation 612, operation 608 may be executed again such that the arbiter circuit loops until a token has been received. In this way, the arbiter circuit refrains for executing a calibration operation until a token is received.

If in operation 608, it is determined that a token has been received and the arbiter circuit is holding the token, the arbiter circuit may be configured, in operation 616 to hold the token until the calibration operation is complete. The arbiter circuit may then activate, in operation 620, its associated calibration circuit to proceed with the calibration operation responsive to the received calibration command. In operation 624, the calibration operation is complete. Following operation 624, the arbiter circuit may proceed to operation 628. In operation 628, the token may be provided along the token ring bus to the next arbiter circuit.

Figure 7:
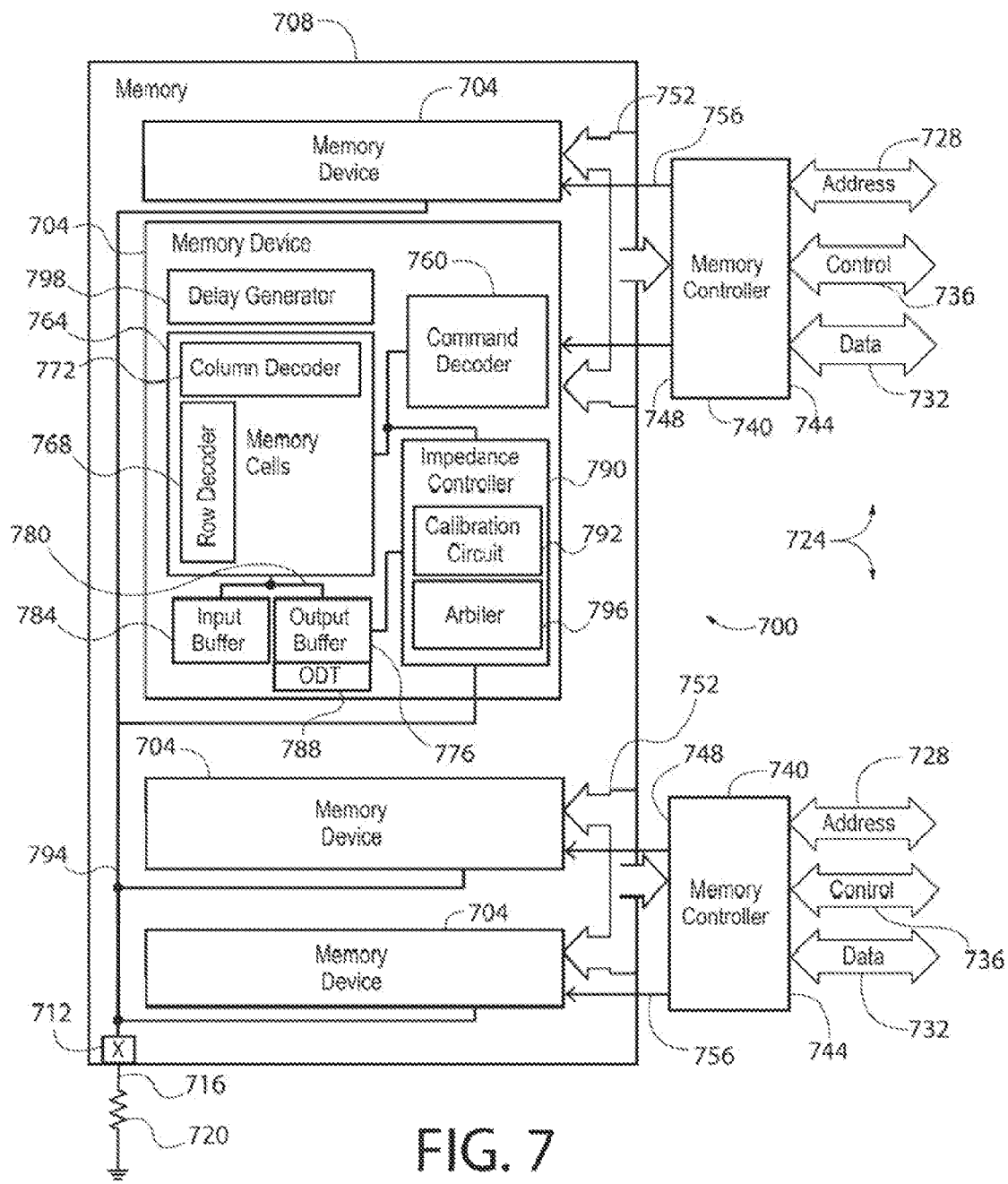
FIG. 7 is block diagram of a semiconductor device in accordance with an alternative embodiment of the present disclosure.

FIG. 7 is block diagram of a semiconductor device in accordance with an alternative embodiment of the present disclosure. Referring to FIG. 7, the semiconductor device of the present disclosure will be described with reference to a semiconductor memory 700, by way of example and not limitation. Like the memory 100 shown in FIG. 7, the memory 700 shown in FIG. 7 includes a number of memory devices 704. The memory devices 704 may be included within a package 708. The package 708 may include a ZQ pad 712, a ZQ pin 716, and a ZQ resistor 720, which are used by the memory devices 704 in various calibration operations. The memory 708 may be provided in association with a plurality of memory controllers 740 that facilitate communication between the memory device 708 and the larger computer system of which the memory 708 is a component. A memory controller 740 may include a front end 744 that couples to an external bus 724 that includes address 728 control 736 and data 732 buses. A memory controller 740 may additionally include a backend 748 through which the memory controller 740 communicates with the various memory devices 704 across shared address data lines 752 and chip select lines 756. The various memory devices 704 include a command decoder 760 configured to receive and process commands from the memory controller 740. Here, the command decoder 760 is coupled to both a memory cell array 764 and an impedance controller 790. The command decoder 760 may be configured to send read/write commands to the memory cells 764, which commands are processed using column decode 772 and row decode 768 components. The memory cells 764 are coupled to an input buffer 784 and an output buffer 776 that transfer data to and from the memory cells 764. As described above in connection with FIG. 1, the calibration circuit 792 is configured to perform a calibration operation responsive to a calibration command so as to adjust a programmable impedance termination component 788 associated with the output buffer 776.

The memory 700 additionally includes an arbiter circuit 796, which differs from the arbiter circuit 196 shown in FIG. 1. The arbiter circuit 796 generally operates by using the same ZQ pin 716 that is used in the calibration process itself to determine whether or not other memory devices 704 are simultaneously using or attempting to use the ZQ pad 712 for calibration. In this regard, each of the arbiter circuits 796 that are connected to the same calibration bus 794 implement an arbitration protocol that allows the various arbiter circuit 796 to take control of the calibration bus 794 to the exclusion of the other arbiter circuits 796 in a predictable manner. The arbitration protocol implemented by the various arbiter circuits 796 may assign a random back-off time for each arbiter circuit 796 that can potentially participate in the arbitration. The random back-off time may be different for each particular arbiter circuit 796 and may specify a time interval used by the arbiter circuit when it attempts to monitor and take control of the ZQ pin 716 and contention for the ZQ pin 716 occurs. When contention of the ZQ pin 716 occurs, each arbiter circuit 796 that is attempting to take control of the ZQ pin 716 senses this contention and backs-off. Each arbiter circuit 796 then pauses for a time period specified by its random back-off time so as to delay its next attempt to take of the ZQ pin 716. Stated another way, a particular arbiter circuit 796 may retry its attempt to take of the ZQ pin 716 once its back-off time interval has expired. Because the back-off times are random, each arbiter circuit 796 will be assigned a different back-off time. Because the back-off times are different, one arbiter circuit 796 will back-off for a shorter time than the others and thus win the race to take control of the pin. In this way, contention of the ZQ pin is resolved.

A particular arbiter circuit 796 may discover its random back-off time through a delay generator component of the memory device 704. As shown in FIG. 7, a delay generator is generally identified with reference numeral 798. The delay generator 798 may be configured to produce a random delay time responsive to a request from the memory device 704. The memory device 704 may make the request for a delay time when the memory device 704 encounters contention on the ZQ pin 716.

Figure 8:
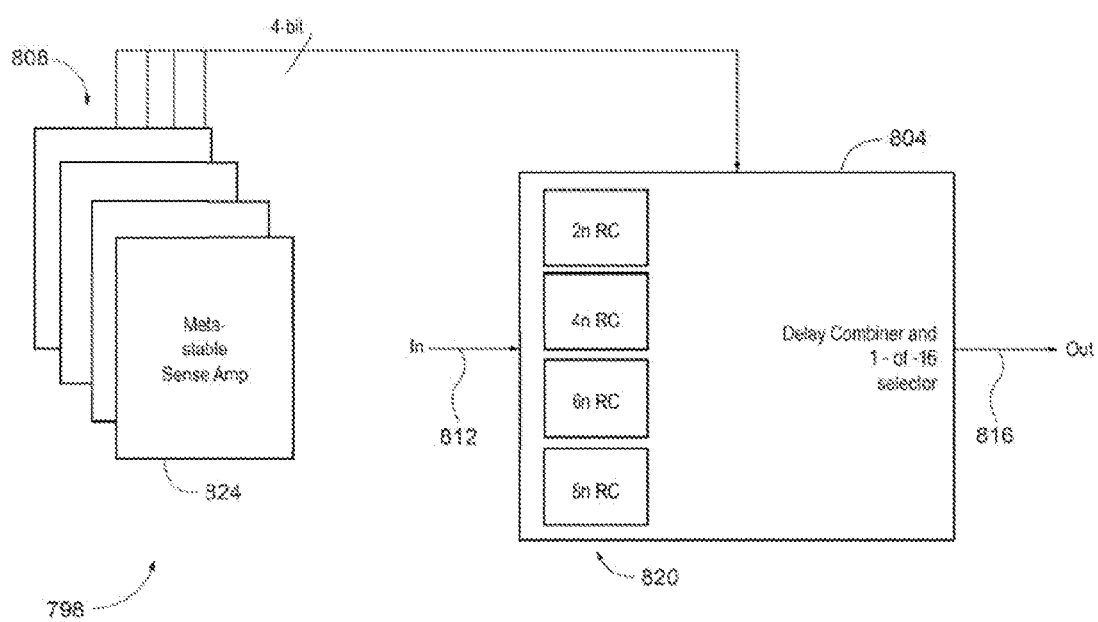
FIG. 8 is a block diagram of a delay generator embodiment in accordance with the present disclosure.

FIG. 8 is an illustration of an embodiment for the delay generator 798. As shown in FIG. 8, the delay generator 798 may include a delay circuit 804 provided in association with a random number generator 808. The delay circuit 804 may include an input line 812 that may be asserted by the memory device 704 when a delay interval is required. In the embodiment shown in FIG. 8, the delay circuit 804 generates a random back-off time response to a request received on the input line 812. The delay circuit 804 may also include an output line 816 that provides the back-off time as an output signal to the memory device 704 responsive to the request.

In one implementation the delay circuit 804 is realized by a plurality of RC delay blocks 820. Each RC delay block 820 may include a particular RC delay. The various delay blocks are enabled or not enabled responsive to a digital code received as input from the random generator 808. The enabled RC delays are combined to form an aggregate delay that is provided as output from the output line 816. As shown in FIG. 8, the various RC delays 820 may be selected by a four bit input from the delay generator 808. The random number generator 808 may include a plurality of metastable sense amplifiers 824. Each metastable sense amplifier 824 randomly produces either a "one" digital value or a "zero" digital value. The metastable sense amplifiers 824 together produce a random for that number is provided as input to the delay generator 804. The delay generator 804 uses the random for that number to select a particular permutation of RC delays which are combined to form the output 816 of the delay generator 804.

In one implementation, the memory device 704 enables the delay generator 798 to provide a delay each time contention of the ZQ pin 716 occurs. Thus, the memory device may be assigned different back-off time intervals at different times. As an alternative to using a delay generator 798, the various memory devices 704 may be assigned different delay times that are fixed. In this embodiment, the delay times used by the various memory devices do not change during the operation of the memory 700.

Figure 9:
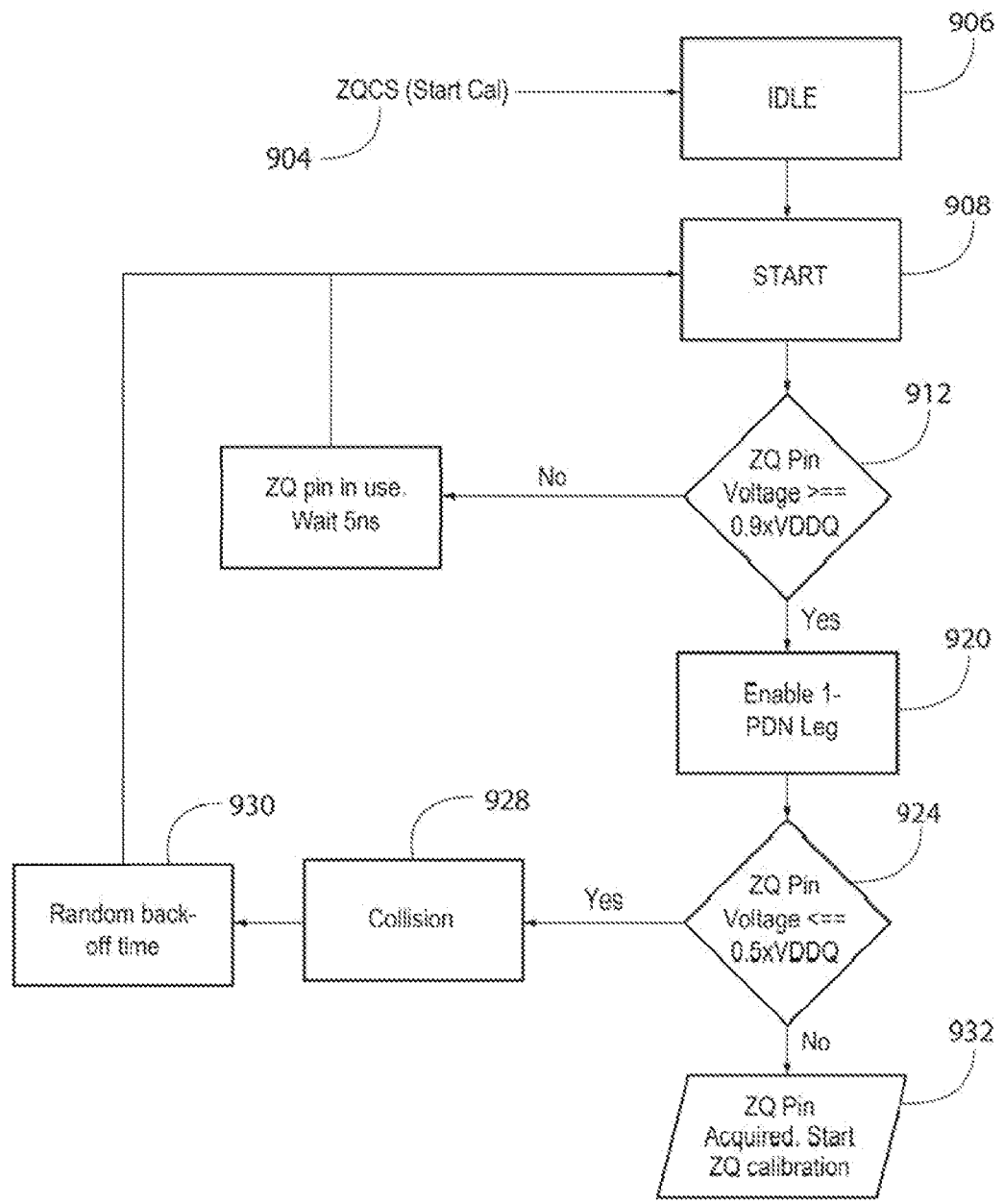
FIG. 9 is a flow diagram for another arbitration method in accordance with the present disclosure.

Turing now to operations executed in a random-back off time arbitration protocol, reference is made to FIG. 9. The following discussion of FIG. 9 makes reference to the configuration of FIG. 7 and FIG. 8, by way of example. FIG. 9 is a flow chart that illustrates operations that may be executed by an arbiter circuit in accordance with the present disclosure that is assigned a random back-off time in a configuration where a number of memory devices are coupled in common to one ZQ pin. As mentioned above, a memory device may be assigned a random back-off time through the operation of a delay generator associated the memory device.

Initially, in operation 904, a calibration command asserted by the system in which the memory 700 is included is received by one of the memory devices 704 associated with the memory 700. The calibration command generally instructs the memory 700 to which it is directed to perform a calibration operation using the ZQ resistor 720 coupled to the ZQ pin 716. Prior to executing the calibration command, the memory device 704 obtains control of the ZQ pin 716 to the exclusion of the other memory devices that could possibly take control of the ZQ pin 716. Thus, prior to executing the calibration command, the memory device 704 enables the arbiter circuit 796 with which it is associated to arbitrate for control of the ZQ pin 716.

In operation 906, control passes to the arbiter circuit 796 so that the arbiter circuit 796 may begin the process of attempting to obtain control of the ZQ pin 716 for use in a calibration process that is to be executed responsive to the calibration command received in operation 804. Prior to control passing to the arbiter circuit 796, the arbiter may be operating in an idle state. As shown in FIG. 9, this idle state of the arbiter is generally indicated by operation 906. Following operation 906, operation 908 may be executed.

In operation 908, the arbiter begins by monitoring the voltage present on the ZQ pin 716 through the operation of a voltage sensor. If the ZQ pin 716 is in use, the voltage on the ZQ pin 716 will be below a power supply voltage ($V_{dd}$). If the ZQ pin 716 is not use, the voltage on the ZQ pin 716 will be at the power supply voltage ($V_{dd}$). Thus, in order to distinguish between these two states, the arbiter generally monitors the voltage on the ZQ pin 716 based on a threshold voltage that is close the power supply voltage. In one implementation, the arbiter circuit 796 monitors the voltage on the first ZQ pin 116 based on a threshold voltage that is 90% of power supply voltage. Following operation 908, operation 912 may be executed.

In operation 912, the arbiter circuit 796 determines if the voltage on the ZQ pin 116 is below the threshold voltage. If, in operation 912, the arbiter circuit 796 determines that the voltage on the ZQ pin 116 is below the threshold voltage, operation 916 may then be executed. In operation 916, the arbiter circuit 796 determines that the ZQ pin 116 is in use. Operation 908 is then executed again following operation 916 such that voltage monitoring on the ZQ pin 116 continues. If, in operation 912, the first arbiter circuit 796 determines that the voltage on the ZQ pin 116 is equal to or above the threshold voltage, operation 920 may then be executed because the ZQ pin 116 is not in use based on the voltage on the ZQ pin 116.

In operation 920, the arbiter circuit 796 sinks a predetermined amount of current from the resistor 120 coupled to the ZQ pin 116 in operation 922. Here, the arbiter circuit 796 generally sinks an amount of current that is sufficient to indicate an attempt to take control of the ZQ pin 116 but not enough to definitively take control of the 2Q pin 220. In one implementation, the arbiter circuit 796 sinks approximately 1 mA of current from the ZQ pin 116. In one implementation, the arbiter circuit 796 may sink 1 mA of current by enabling one pull-down transistor in a set of transistors where the full set of pull-down transistors is used to sink greater amounts of current. Following operation 920, operation 924 may be executed.

In operation 924, the arbiter circuit 796 again monitors the voltage present on the ZQ pin 116. As mentioned, the arbiter circuit 796 will take control of the ZQ pin 116 by sinking a predetermined amount of current from the pin provided that no other arbiter circuit also attempts to take control of the pin. The arbiter circuit 796 discovers the presence of the other arbiter circuits attempting to take control of the pin through the voltage monitoring conducted in operation 924. If another arbiter circuit is attempting to take control of the ZQ pin 716, the voltage on the pin will fall to less than a specified voltage. (i.e. a half of a power supply voltage ($V_{ddq/2}$)) If another arbiter circuit is not attempting to take control of the ZQ pin 716, the voltage on the pin will not be less than half of the power supply voltage ($V_{ddq/2}$). Thus, in order to distinguish between these two states, the arbiter circuit 796 generally monitors the voltage on the ZQ pin 116 based on a threshold voltage that is half of the power supply voltage.

If, in operation 924, the arbiter circuit 796 determines that the voltage on the ZQ pin 710 is below the threshold voltage, operation 928 may then be executed. In operation 928, the arbiter circuit 796 determines that another arbiter is attempting to obtain control of the ZQ pin 116. In response to this determination, the arbiter circuit 796 delays further voltage monitoring for a back-off time that is assigned to the arbiter circuit 796 (operation 930). As mentioned, the back-off time may be randomly generated or assigned to the arbiter such that the back-off time is fixed throughout the operation of the memory 700. Operation 908 is then executed again following operation 930 such that voltage monitoring on the ZQ pin 116 continues. If, in operation 924, the arbiter determines that the voltage on the ZQ pin 116 is not below the threshold voltage for the predetermined time, operation 932 may then be executed.

In operation 932, the arbiter circuit 796 has obtained control of the ZQ pin 116. At this point, the arbiter circuit 796 may activate an associated calibration circuit 792 to begin a calibration process. Thus, based on the two voltage monitoring steps described above, the arbiter circuit 796 activates calibration circuit 792 responsive, at least in part, to the assertion of a calibration command when a voltage sensor detects that the voltage on the ZQ pin 716 is in a first voltage range defined between the power supply voltage and the second threshold voltage of half the power supply voltage ($V_{ddq/2}$). Further, based on the two voltage monitoring steps described above, the arbiter circuit 796 keeps the calibration circuit 792 inactive when a voltage sensor detects that the voltage on the ZQ pin 716 is in a second voltage range defined between the second threshold voltage of half the power supply voltage ($V_{ddq/2}$) and ground.

Figure 10:
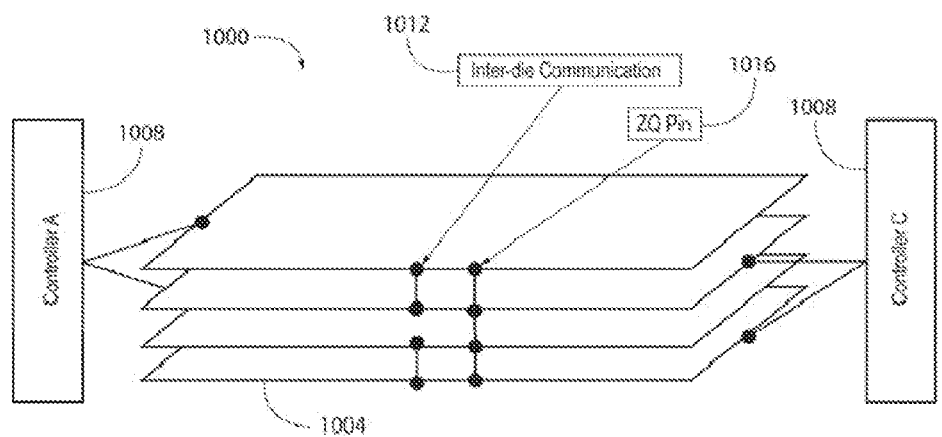
FIG. 10 schematic illustration of an example semiconductor die configuration in accordance with the present disclosure

FIG. 10 is an example semiconductor die configuration 1000 in accordance with the present disclosure. The semiconductor die configuration 1000 includes a number of memory devices 1004 each arranged on a particular semiconductor die. The memory devices 1004 may be arranged within a common package as described above in connection with FIG. 1 and FIG. 7. Each memory devices 1004 may be associated with a controller 1008. As mentioned, a controller 1008 may be configured to facilitate communication between one or more of the memory devices 1004 and the larger computer system with which the memory device 1000 is associated. As shown in FIG. 10, the memory 1000 may include one or more external traces which provide inter-die communication 1012. In one arrangement, the inter-die communication 1012 connection form part of the token ring bus used by the various memory devices 1004. The memory devices 1004 may use the token ring bus to arbitrate for control of the ZQ pin 1016 for use in a calibration process as described herein. As shown in FIG. 10, the ZQ pin 1016 may additionally be implemented with an external trace 1016 that extends between the various memory devices 1004.

The above specification, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. An apparatus comprising:
   first and second memory devices; and
   a resistor coupled in common to the first and second memory devices;
   the first memory device comprising a first calibration circuit configured to perform, when activated, a first calibration operation based on the resistor and a first arbiter configured to activate the first calibration circuit responsive, at least in part, to an assertion of a first command or keep the first calibration circuit inactive irrespective of the assertion of the first command; and
   the second memory device comprising a second calibration circuit configured to perform, when activated, a second calibration operation based on the resistor and a second arbiter configured to activate the second calibration circuit responsive, at least in part, to an assertion of a second command or keep the second calibration circuit inactive irrespective of the assertion of the second command.

2. The apparatus of claim 1, wherein the first memory device and the second memory device are packaged independently of each other.

3. The apparatus of claim 1, wherein the first memory device and the second memory device are packaged in one package.

4. The apparatus of claim 1, further comprising a ring-shaped bus on which the first arbiter and the second arbiter are serially coupled and an enable signal is transmitted, wherein the first arbiter is configured to activate the first calibration circuit responsive, at least in part, to the assertion of the first command while keeping the enable signal therein and configured to keep the first calibration circuit inactive irrespective of the assertion of the first command when free from the enable signal and the second arbiter is configured to activate the second calibration circuit responsive, at least in part, to the assertion of the second command while keeping the enable signal therein and configured to keep the second calibration circuit inactive irrespective of the assertion of the second command when free from the enable signal.

5. The apparatus of claim 4, wherein the first arbiter is configured to keep the enable signal for a predetermined time in the event that the enable signal is received at the first memory device prior to the first command being received at the first memory device and the second arbiter is configured to keep the enable signal for a predetermined time in the event that the enable signal is received at the second memory device prior to the first command being received at the second memory device.

6. The apparatus of claim 4, wherein the first arbiter includes a first latch configured to receive and store the enable signal response to a first activation signal and the second arbiter includes a second latch configured to receive and store the enable signal response to a second activation signal.

7. The apparatus of claim 1, wherein the first arbiter includes a first voltage sensor configured to detect a first voltage of a first terminal coupled to the resistor and the second arbiter includes a second voltage sensor configured to detect a second voltage of a second terminal coupled to the resistor, the first arbiter being configured to activate the first calibration circuit responsive, at least in part, to the assertion of the first command when the first voltage sensor detects that the first voltage is in a first voltage range and configured to keep the first calibration circuit inactive irrespective of the assertion of the first command when the first voltage sensor detects that the first voltage is in a second voltage range, the second arbiter being configured to activate the second calibration circuit responsive, at least in part, to the assertion of the second command when the second voltage sensor detects that the second voltage is in the first voltage range and configured to keep the second calibration circuit inactive irrespective of the assertion of the second command when the second voltage sensor detects that the second voltage is in the second voltage range.

8. The apparatus of claim 7, wherein, in the event that the first voltage is in the second voltage range, the first arbiter is configured to refrain from further voltage detection on the resistor for a first back-off time assigned to the first arbiter and, in the event that the second voltage is in the second voltage range, the second arbiter is configured to refrain from further voltage detection on the resistor for a second back-off time assigned to the second arbiter.

9. The apparatus of claim 8, further comprising a first delay generator configured to assign the first back-off time to the first arbiter based on a first random number and a second delay generator configured to assign the second back-off time to the second arbiter based on a second random number.

10. The apparatus of claim 9, wherein the first delay generator includes a first plurality of metastable sense amplifiers configured to generate the first random number, the first random number used by a first plurality of RC delay blocks to form a first aggregate delay that is used to determine the first back-off time, and wherein the second delay generator includes a second plurality of metastable sense amplifiers configured to generate the second random number, the second random number used by a second plurality of RC delay blocks to form a second aggregate delay that is used to determine the second back-off time.

11. The apparatus of claim 9, wherein the first delay generator is configured to determine the first back-off time which is stable during the operation of the first memory device and the second delay generator is configured to determine the second back-off time which is stable during the operation of the second memory device.

\* \* \* \* \*